United States Patent [19]

Rodrigues

[11] Patent Number: 5,405,813
[45] Date of Patent: Apr. 11, 1995

[54] OPTIMIZED PHOTORESIST DISPENSE METHOD

[75] Inventor: Michael A. Rodrigues, San Jose, Calif.

[73] Assignee: VLSI Technology, Inc., San Jose, Calif.

[21] Appl. No.: 214,484

[22] Filed: Mar. 17, 1994

[51] Int. Cl.$^6$ .......................................... H01L 21/469
[52] U.S. Cl. .................. 437/231; 427/126.1; 427/240; 427/384
[58] Field of Search ............... 427/240, 126.1, 384; 437/231

[56] References Cited

U.S. PATENT DOCUMENTS

| | | | |
|---|---|---|---|
| 4,741,926 | 5/1988 | White et al. | 427/240 |
| 4,822,639 | 4/1989 | Fujii et al. | 427/240 |
| 5,066,616 | 11/1991 | Gordon | 427/240 |

OTHER PUBLICATIONS

"Rheology and Modeling of the Spin Coating Process" by B. D. Washo, Systems Products Division Development laboratory, IBM, Poughkeepsie, N.Y. from IBM J Res. Develop. Mar. 1977.

"Characteristics of Resist Films Produced by Spinning" J. Appl. Phys. 49 (7), Jul. 1978 by Dietrich Meyerhofer, RCA Laboratories, David Sarnoff Research Center, Princeton, N.J.

*Primary Examiner*—Shrive Beck
*Assistant Examiner*—Benjamin L. Utech
*Attorney, Agent, or Firm*—Patrick T. King

[57] ABSTRACT

A method and process for reducing the amount of photoresist material required to uniformly coat a semiconductor wafer. A semiconductor wafer, having a top and a bottom surface, is placed onto a vacuum chuck of a photoresist coater system for applying photoresist to semiconductor wafers such that the semiconductor wafer is oriented in horizontal plane with the top surface of the semiconductor facing upwards. The vacuum chuck of the wafer coating system is rotated about a central axis thereof such that the semiconductor wafer achieves a first rotational speed. Next, the semiconductor wafer is decelerated from the first rotational speed to a second rotational speed while a minimal amount of photoresist material is concurrently dispensed onto the top surface of the semiconductor wafer. As the wafer reaches the second rotational speed, the dispensing of the photoresist material onto the top surface of the semiconductor wafer is stopped. The semiconductor wafer is then accelerated from the second rotational speed to a third rotational speed. Upon reaching the third rotational speed, the semiconductor wafer is maintained at the third rotational speed such that the photoresist material is spread in a uniform layer over the top surface of the semiconductor wafer. Next, the semiconductor wafer is accelerated from the third rotational speed to a fourth rotational speed, and is maintained at the fourth rotational speed such that the uniform layer of the photoresist material on the top surface of the semiconductor wafer is dried. In so doing, the present claimed invention forms a layer of photoresist of uniform thickness over the top surface of a semiconductor wafer while simultaneously reducing the amount of photoresist material used in the coating process.

19 Claims, 2 Drawing Sheets

OPTIMIZED PHOTORESIST DISPENSE METHOD

BACKGROUND OF THE INVENTION

1. Field of the Invention

The present claimed invention relates to the field of semiconductor device fabrication. More specifically, the present claimed invention relates to the deposition of photoresist onto semiconductor wafers.

2. Prior Art

During conventional applications of photoresist coatings to semiconductor wafers, a "coater" system is used. One part of the coater system is a fiat, circular, disk-shaped, rotating vacuum chuck having a diameter slightly less than that of a semiconductor wafer. The vacuum chuck is used to hold and rotate a semiconductor wafer during the photoresist application process. The vacuum chuck is oriented such that a semiconductor wafer placed thereon resides in a level horizontal plane. In operation, the bottom or inactive surface of a semiconductor wafer is placed onto the vacuum chuck. The vacuum chuck applies a suction or negative pressure to the bottom surface of the semiconductor wafer to hold the semiconductor wafer on the vacuum chuck. In standard photoresist coater systems, an axle extends downward from the vacuum chuck and is powered by motors to rotate the vacuum chuck.

Commonly, a desired amount of liquid photoresist is applied to the top upwardly-facing surface of the semiconductor wafer while the semiconductor wafer is being rotated on the vacuum chuck. Thus, as the semiconductor wafer is rotating, the photoresist material spreads radially outward from the center of the semiconductor wafer towards the edge of the semiconductor wafer such that the entire top or active surface of the wafer is coated with a layer of photoresist. Excess photoresist material is sloughed off of the wafer during the rotation process. The fixed speed of rotation of the semiconductor wafer and the amount of photoresist applied are set at different fixed values in an attempt to achieve a layer of photoresist of a uniform desired or "target" thickness.

Unfortunately, variations from the target thickness of the photoresist layer commonly occur across the surface of the semiconductor wafer. That is, for example, the thickness of the photoresist layer may be much greater at the center of the wafer than at the edge of the wafer. Other variations are also possible such as, for example, a "bowl-shaped" distribution wherein the photoresist layer is much thicker at the edges of the wafer than at the center thereof.

In addition to variations in the thickness of the photoresist layer across the surface of a single semiconductor wafer, unwanted variations also occur from wafer to wafer. That is, a first wafer may have a first mean photoresist layer thickness, and a second wafer processed concurrently with the first wafer will have a second mean photoresist layer thickness wherein the first and second mean thicknesses are different from each other.

It is well known that variations from the target thickness of the photoresist layer across the surface of the semiconductor wafer deleteriously affect critical dimensions during subsequent process steps which the semiconductor wafer undergoes. Specifically, variations in the photoresist layer from the target thickness affect, for example, linewidth control at the poly layer. That is, at the target thickness a certain linewidth will be obtained during subsequent photolithography steps. However, different linewidths will be generated on the same wafer if the thickness of the photoresist layer varies from the target thickness. Thus, the uniformity of the photoresist layer is critical to achieving, for example, precise linewidth control at the poly layer.

In an attempt to achieve a uniform layer of photoresist material across the top surface of a semiconductor wafer, a large volume of photoresist material may be applied to the top surface of the wafer. While the wafer is spinning at a high rate of speed, the photoresist material coats the surface of the wafer and the excess photoresist material is cast off of the wafer as waste. However, due to the extremely high cost of photoresist material, such practices dramatically increase process costs. Therefore, in an attempt to reduce the amount of photoresist required, the fixed wafer spin speed is set at a higher fixed rate, and/or the dispensed amount of photoresist is decreased. However, the reduced amount of photoresist and the increased fixed wafer spin speed can result in incomplete coverage and even in less uniformity in the thickness of the layer of photoresist across the surface of the semiconductor wafer.

Commonly, some loss of uniformity in the layer of photoresist material across the top surface of the semiconductor wafer has been tolerated in exchange for the cost savings which are realized by using less photoresist material. That is, even though the increased wafer speed and reduced amount of photoresist result in variations from the target thickness of the photoresist layer, in the past such adverse results have been tolerated in order to reduce process costs.

Thus, the need has arisen for a method or process which simultaneously provides for the formation of a uniform layer of photoresist material onto the top surface of a semiconductor wafer and which does so using a decreased amount of photoresist material.

SUMMARY OF THE INVENTION

It is therefore an object of the present invention to provide a method or process which simultaneously provides for the formation of a uniform layer of photoresist material onto the top surface of a semiconductor wafer and which does so using a decreased amount of photoresist material. The above object has been achieved with a method which includes the step of concurrently decelerating a semiconductor wafer from a first rotational speed to a second rotational speed and dispensing a photoresist material onto the top surface of the semiconductor wafer at a slow constant rate during the deceleration of the semiconductor wafer.

In one embodiment of the present claimed invention, the bottom surface of a semiconductor wafer is placed onto a vacuum chuck of a photoresist coater system for applying photoresist to semiconductor wafers such that the semiconductor wafer is oriented in horizontal plane with the top surface of the semiconductor facing upwards. The vacuum chuck of the wafer coating system is rotated about a central axis thereof such that the semiconductor wafer achieves a first rotational speed. The semiconductor wafer is maintained at the first rotational speed momentarily, such that the semiconductor wafer becomes stabilized at the first rotational speed.

Next, the semiconductor wafer is concurrently decelerated from the first rotational speed to a second rotational speed and photoresist material is dispensed onto the top surface of the semiconductor wafer at a slow constant rate during the deceleration of the semiconductor wafer. When the wafer reaches the second rotational speed, the dispensing of the photoresist material onto the top surface of the semiconductor wafer is stopped.

The semiconductor wafer is then accelerated from the second rotational speed to a third rotational speed and maintained at the third rotational speed such that the photoresist material is spread in a uniform layer over the top surface of the semiconductor wafer. Next, the semiconductor wafer is accelerated from the third rotational speed to a fourth rotational speed and is maintained at the fourth rotational speed such that the uniform layer of the photoresist material on the top surface of the semiconductor wafer is dried.

In so doing, the present claimed invention provides a method for forming a uniform layer of photoresist material onto the top surface of a semiconductor wafer and does so using a decreased amount of photoresist material.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

Figure 1:
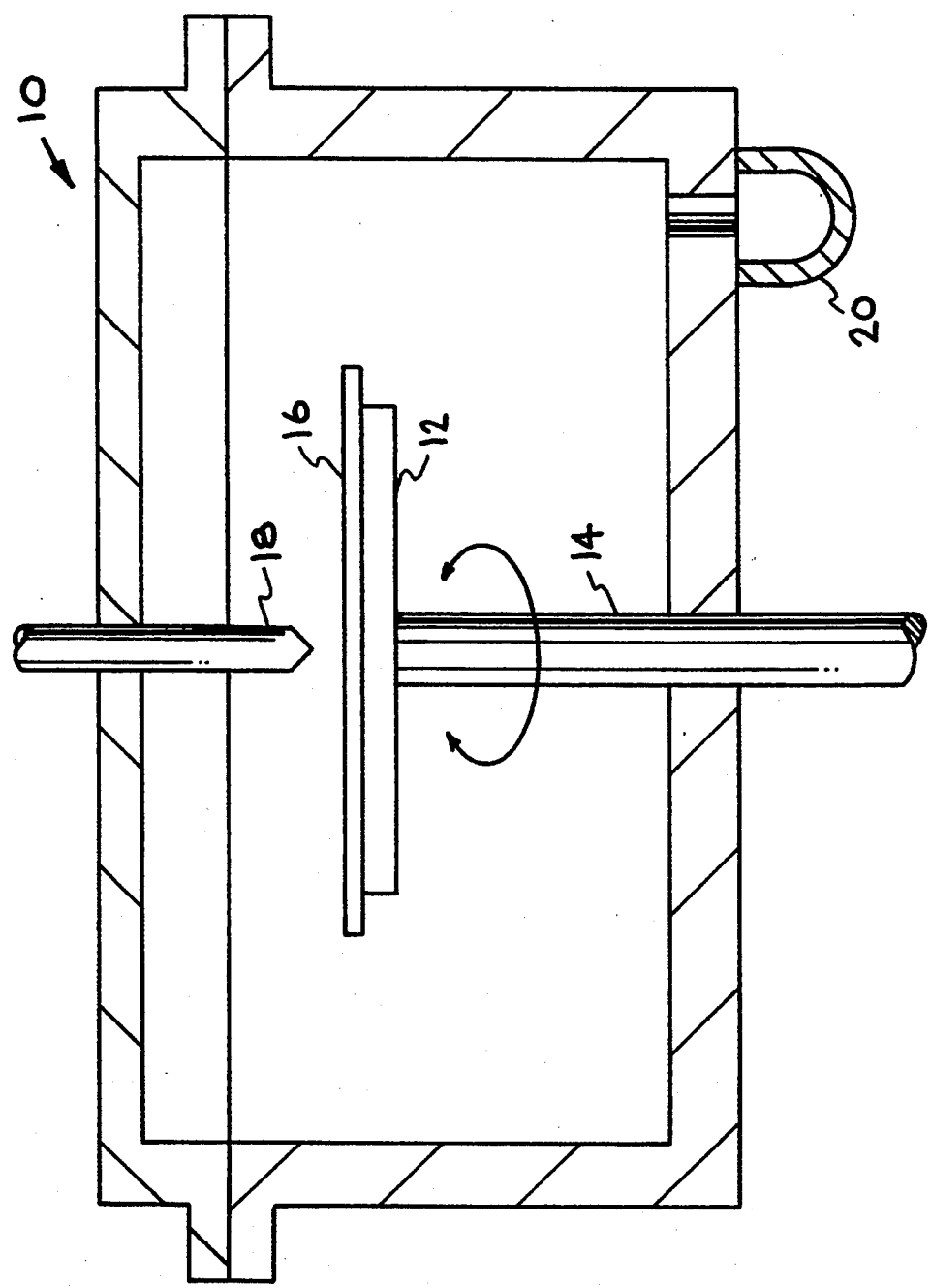
FIG. 1 is a cut-away view of a simplified conventional Prior Art coater system having a semiconductor wafer located on a vacuum chuck.

With reference now to Prior Art FIG. 1, a simplified view of a conventional coater system is shown. In the coater system 10 of Prior Art FIG. 1, a vacuum chuck 12 has a spindle 14 centrally attached thereto. Spindle 14 rotates vacuum chuck 12 as indicated by the arrows. A semiconductor wafer 16 has the inactive or back surface thereof mounted onto vacuum chuck 12 such that the active or top surface of semiconductor wafer 16 is facing upwards. Vacuum chuck 12 applies suction or negative pressure to hold semiconductor wafer 16 in place during the coating process. As shown in Prior Art FIG. 1, semiconductor wafer 16 is oriented in a level horizontal plane within coater system 10. The following detailed description will first describe and illustrate the structure of typical photoresist layers formed by Prior Art processes, and will also describe and illustrate a photoresist layer formed according to the method of the present claimed invention. The detailed description will then set forth in detail the claimed method of the present invention for forming a uniform layer of photoresist material onto the top surface of a semiconductor wafer wherein the claimed method uses a decreased amount of photoresist material.

Referring again to Prior Art FIG. 1, a photoresist dispensing nozzle 18 is centrally located above semiconductor wafer 16. During typical operation, photoresist is dispensed by nozzle 18 onto semiconductor wafer 16 while semiconductor wafer 16 is being spun at a high rotational speed. Excess photoresist is sloughed off of semiconductor wafer 16 and is collected, for example, in a drain cup 20.

Figure 2A:
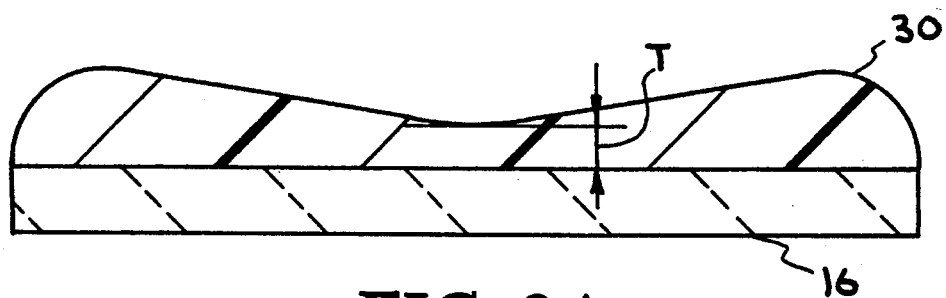
FIGS. 2A and 2B are cross sectional views of semiconductor wafers having non-uniform photoresist layers formed thereon.
Figure 2B:
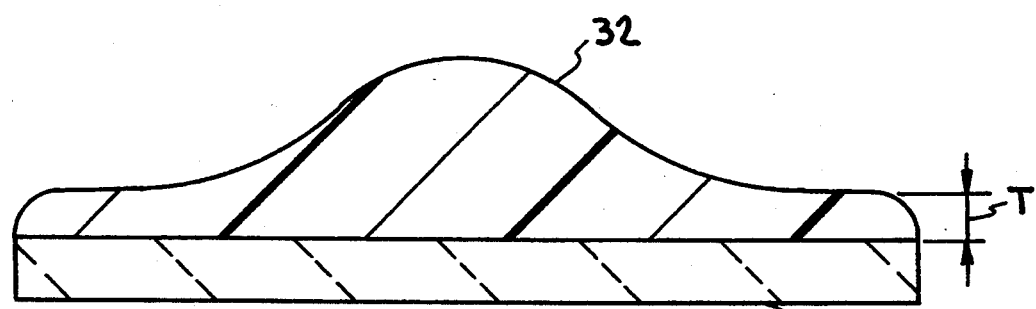

With reference next to Prior Art FIGS. 2A-2B, cross sections of semiconductor wafers having non-uniform photoresist layers are shown. In each of Prior Art FIGS. 2A-2B, the thickness of the photoresist layer varies, across the surface thereof, from a target thickness "T".

With reference to Prior Art FIG. 2A, a "bowl-shaped" layer of photoresist 30 is shown. In Prior Art FIG. 2A, layer of photoresist 30 is thicker at the edges of semiconductor wafer 16 than at the center of wafer 16. That is, while a target thickness T might be achieved at the central portion of wafer 16, photoresist layer 30 exceeds the target thickness T at the edges of wafer 16. As a result, critical dimensions such as, for example, linewidth at the poly layer will vary on the same wafer due to the variations in the thickness of the photoresist layer.

Referring now to Prior Art FIG. 2B, the layer of photoresist 32 deposited onto semiconductor wafer 16 is thicker at the center of wafer 16 than at the edges of wafer 16. As stated above, variations in the thickness of photoresist layer 32 from the target thickness T will adversely affect subsequent processing steps to which semiconductor wafer 16 will be subjected.

Figure 3:
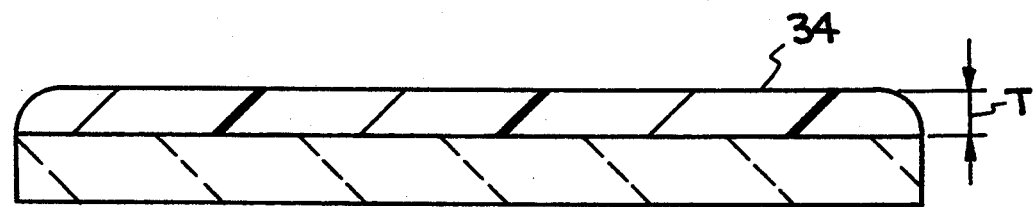
FIG. 3 is a cross section of a semiconductor wafer having a layer of photoresist formed thereon in accordance with the method of the present claimed invention.

With reference now to FIG. 3, a cross section of a semiconductor wafer having a layer of photoresist formed thereon according to the method of the present claimed invention is shown. Photoresist layer 34 of FIG. 3 has a substantially uniform thickness "T" across the entire surface of semiconductor wafer 16. Additionally, the amount of photoresist used to form layer 34 is substantially less than the amount of photoresist required to form layers 30 and 32 of Prior Art FIGS. 2A and 2B, respectively.

THE METHOD OF THE PRESENT CLAIMED INVENTION

In the present claimed invention, a photoresist dispense pump having a repeatability of at least in the range of approximately plus or minus 0.03 grams is necessary. Additionally, the motor which drives the spindle of the photoresist coater should have acceleration and deceleration control to within plus or minus 100 rpm/s. Although most "state of the art" coater systems have such control parameters, even older less refined coater systems can be modified to achieve such a level of performance and control with minimal trouble.

The method of the present claimed invention applies photoresist at a very slow dispense rate to a semiconductor wafer constantly decelerating from a very high speed to a very low speed in order to achieve a uniform layer of photoresist across the top surface of a semiconductor wafer using a minimal amount of photoresist.

In the present claimed invention, the bottom surface of a semiconductor wafer is placed onto a vacuum chuck 12 of a photoresist coater system 10, as shown in Prior Art FIG. 1, for applying photoresist to semiconductor wafers such that the semiconductor wafer is oriented in horizontal plane with the top surface of the semiconductor facing upwards. Next, the vacuum chuck of the wafer coating system is rotated about a central axis thereof such that the semiconductor wafer achieves a first rotational speed. In the present embodiment, the first rotational speed is in the range of approximately 3000–7000 rpm. Although such a speed is used in the present embodiment, the present claimed invention is also well suited to numerous variations in the first rotational speed.

After the semiconductor wafer reaches the first rotational speed, the semiconductor wafer is maintained at the first rotational speed for a few seconds, typically in the range of approximately 1–5 seconds, such that the semiconductor wafer becomes stabilized at the first rotational speed.

Next, after the semiconductor wafer has become stabilized at the first rotational speed, the semiconductor wafer is concurrently decelerated from the first rotational speed to a second rotational speed while photoresist material is applied to the top surface of the semiconductor wafer. Specifically, the semiconductor wafer is decelerated from the first rotational speed to the second rotational speed, which in the present embodiment is in range of approximately 150–250 rpm, at a constant rate of deceleration in the range of approximately 50 to 150 rpm/sec. During the deceleration of the semiconductor wafer from the first rotational speed to the second rotational speed, photoresist material is centrally dispensed onto the top surface of the semiconductor wafer at a slow constant rate. In the present embodiment, the photoresist is dispensed at a constant rate in the range of approximately 0.2 to 0.7 grams/sec. The photoresist is dispensed throughout the entire deceleration of the semiconductor wafer from the first rotational speed to the second rotational speed such that in the range of approximately 1.5–3.5 grams of the photoresist material are dispensed onto the top surface of the semiconductor wafer. When the semiconductor wafer reaches the second rotational speed, the dispensing of the photoresist material onto the top surface of the semiconductor wafer is stopped.

Thus, one substantial benefit of the present claimed invention is the substantially reduced amount of photoresist material which is required coat the top surface of the semiconductor wafer. That is, in many typical prior art photoresist coating methods, 5 grams or more of photoresist is applied to the top surface of each semiconductor wafer. In many of the prior art coating methods, often 2–3 times as much photoresist as finally remains on the wafer is applied during the dispense step. Because the prior art methods typically spin the wafer at a constant high speed, the excess photoresist is sloughed off as waste during the coating process. However, due to the concurrent deceleration and dispensing of the photoresist, the present claimed method substantially reduces the amount of photoresist which is wasted in prior art coating methods. Specifically, the present claimed method has been found to reduce photoresist usage by as much as 50%.

As a result of reduced photoresist usage, process cost have also been reduced by the method of the present claimed invention. Typical photoresist such as, for example, TSMR-8900s-2 photoresist manufactured by OHKA America, Inc. of Gotemba, Japan costs approximately $500.00 per gallon. Thus, photoresist is one of the most expensive chemicals used in semiconductor wafer fabrication processes. Hence, by reducing the amount of wasted photoresist, the method of the present claimed invention reduces the cost to coat each semiconductor wafer. The savings provided by the method of the present claimed invention can easily add up to millions of dollars per year for a semiconductor fabrication facility, depending upon the number of wafers processed.

In the next step of the present claimed method, the semiconductor wafer is accelerated at a constant rate in the range of approximately 100–500 rpm/sec from the second rotational speed to a third rotational "spread" speed. In the present embodiment, the third rotational or spread speed is in the range of approximately 800–1500 rpm. The semiconductor wafer is then maintained at the third rotational speed for in the range of approximately 3–7 seconds, such that the photoresist material previously deposited onto the wafer is spread in a uniform layer over the top surface of the semiconductor wafer. That is, any photoresist material which has accumulated in the center portion of the semiconductor wafer during the dispensing step, especially as the wafer approached the slower second rotational speed, will be evenly distributed over the entire top surface of the semiconductor wafer. As a result, a photoresist layer of uniform "target" thickness is formed across the top surface of the semiconductor wafer. In the present embodiment, the target thickness is in the range of approximately 1–2 microns. However, the present claimed invention is also well suited to obtaining uniform layers of photoresist having numerous different target thicknesses.

The method of the present claimed invention has been found to improve uniformity by as much as 30% over prior art photoresist coating methods. That is, in prior art photoresist layers the difference in the thickness on a single semiconductor wafer between the thinnest portion of the layer and the thickest portion of the layer will vary by as much as several hundred angstroms. However, in photoresist layers formed by the method of the present claimed invention, the variation is typically in the range of approximately 30–80 angstroms.

In the final step of the method of the present claimed invention, after rotating the semiconductor wafer at the third rotational or spread speed for a few seconds, the semiconductor wafer is accelerated at a constant rate in the range of approximately 5000 rpm/sec from the third rotational speed to a fourth rotational or "drying" speed. In the present embodiment, the fourth rotational or "drying" speed is in the range of approximately 5000 rpm. In the present embodiment, the semiconductor wafer is maintained at the fourth rotational or drying speed for in the range of approximately 6–8 seconds such that the uniform layer of the photoresist material on the top surface of the semiconductor wafer is dried.

As an additional benefit, the present claimed invention also provides increased repeatability between semiconductor wafers. That is, using the method of the present claimed invention, the variance in mean thickness between separate semiconductor wafers is reduced. In typical prior art photoresist coater methods, the variance between the mean thickness of the layer of photoresist "Delta of Means" on separate wafers coated at the same time, will be as high as several hundred angstroms. However, using the method of the present claimed invention, the Delta of Means is typically in the range of approximately 20-60 angstroms.

Thus, the method of the present claimed invention, provides for the formation of a uniform layer of photoresist material onto the top surface of a semiconductor wafer and which does so using a decreased amount of photoresist material. Additionally, the present claimed invention reduces the costs associated with the formation of a photoresist layer, and provides increased repeatability between the mean thickness of the photoresist layer on separate semiconductor wafers.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

I claim:

1. A method for uniformly coating a semiconductor wafer with photoresist material comprising the steps off
   accelerating a semiconductor wafer about a central axis thereof such that said semiconductor wafer achieves a first rotational speed,
   decelerating said semiconductor wafer from said first rotational speed to a second rotational speed while concurrently dispensing a photoresist material onto a top surface of said semiconductor wafer during said deceleration of said semiconductor wafer,
   ceasing said dispensing of said photoresist material onto said top surface of said semiconductor wafer as said wafer reaches said second rotational speed,
   accelerating said semiconductor wafer from said second rotational speed to a third rotational speed, said third rotational speed being less than said first rotational speed,
   maintaining said semiconductor wafer at said third rotational speed, such that said photoresist material is spread in a uniform layer over said top surface of said semiconductor wafer,
   accelerating said semiconductor wafer from said third rotational speed to a fourth rotational speed, said fourth rotational speed being greater than said third rotational speed and having a velocity great enough to cause said photoresist material to begin drying, and
   maintaining said semiconductor wafer at said fourth rotational speed such that said uniform layer of said photoresist material on said top surface of said semiconductor wafer is dried.

2. The method as recited in claim 1 wherein said step of accelerating said semiconductor wafer such that said semiconductor wafer achieves a first rotational speed in the range of 3000-7000 rpm.

3. The method as recited in claim 1 wherein said step of accelerating said semiconductor wafer such that said semiconductor wafer achieves a first rotational speed further includes maintaining said first rotational speed of said semiconductor wafer such that said semiconductor wafer becomes stabilized with said semiconductor wafer consistently rotating at or very near said first rotational speed.

4. The method as recited in claim 3 wherein said first rotational speed of said semiconductor wafer is maintained at said first rotational speed in the range of 3-5 seconds.

5. The method as recited in claim 1 wherein said step of decelerating said semiconductor wafer from said first rotational speed to said second rotational speed while concurrently applying said photoresist material to the top surface of said semiconductor wafer further includes decelerating said semiconductor wafer at a constant deceleration in the range of 50 to 150 rpm/sec.

6. The method as recited in claim 1 wherein said second rotational speed is in the range of 150-250 rpm.

7. The method as recited in claim 1 wherein said step of decelerating said semiconductor wafer from said first rotational speed to said second rotational speed while concurrently applying said photoresist material to said top surface of said semiconductor wafer further includes centrally applying said photoresist material to said top surface of said semiconductor wafer.

8. The method as recited in claim 1 wherein said step of decelerating said semiconductor wafer from said first rotational speed to said second rotational speed while concurrently applying said photoresist material to said top surface of said semiconductor wafer further includes applying said photoresist material to said top surface of said semiconductor wafer at a constant rate in the range of 0.2-0.7 grams/sec.

9. The method as recited in claim 1 wherein said step of decelerating said semiconductor wafer from said first rotational speed to said second rotational speed while concurrently applying said photoresist material to said top surface of said semiconductor wafer further includes applying in the range of 1.5-3.5 grams of said photoresist material to said top surface of said semiconductor wafer.

10. The method as recited in claim 1 wherein said step of accelerating said semiconductor wafer from said second rotational speed to said third rotational speed further includes accelerating said semiconductor wafer at a constant acceleration in the range of 100-500 rpm/sec.

11. The method as recited in claim 1 wherein said third rotational speed is in the range of 800-1500 rpm.

12. The method as recited in claim 1 wherein said step of maintaining said rotational speed of said semiconductor wafer at said third rotational speed further includes maintaining said third rotational speed in the range of 3-7 seconds.

13. The method as recited in claim 1 wherein said fourth rotational speed is approximately 5000 rpm.

14. The method as recited in claim 1 wherein said step of accelerating said semiconductor wafer from said third rotational speed to said fourth rotational speed further includes accelerating said semiconductor wafer at a constant acceleration of approximately 5000 rpm.

15. The method as recited in claim 1 wherein said step of maintaining said rotational speed of said semiconductor wafer at said fourth rotational speed further includes maintaining said fourth rotational speed in the range of 6-8 seconds.

16. A process for forming a uniform layer of photoresist material onto the top surface of a semiconductor wafer comprising the steps of:

placing the bottom surface of a semiconductor wafer onto a vacuum chuck of a photoresist coating system for applying photoresist to semiconductor wafers such that said semiconductor wafer is oriented in the horizontal plane with said top surface of said semiconductor facing upwards, rotating said vacuum chuck of said wafer coating system about a central axis thereof such that said semiconductor wafer achieves a first rotational speed in the range of 3000-7000 rpm, maintaining said first rotational speed of said semiconductor wafer such that said semiconductor wafer becomes stabilized with said semiconductor wafer consistently rotating at or very near at said first rotational speed, decelerating said semiconductor wafer from said first rotational speed to a second rotational speed in the range of 150-250 rpm while concurrently centrally dispensing a photoresist material onto said top surface of said semiconductor wafer at a constant rate in the range of 0.2 to 0.7 grams/sec during said deceleration of said semiconductor wafer, ceasing said dispensing of said photoresist material onto said top surface of said semiconductor wafer as said wafer reaches said second rotational speed, accelerating said semiconductor wafer at a constant acceleration in the range of 100-500 rpm/sec from said second rotational speed to a third rotational speed in the range of 800-1500 rpm, maintaining said rotational speed of said semiconductor wafer at said third rotational speed for in the range of 3-7 seconds, such that said photoresist material is spread in a uniform layer over said top surface of said semiconductor wafer, accelerating said semiconductor wafer at a constant acceleration in the range of 5000 rpm/sec from said third rotational speed to a fourth rotational speed in the range of 5000 rpm, maintaining said rotational speed of said semiconductor wafer at said fourth rotational speed for in the range of 6-8 seconds such that said uniform layer of said photoresist material on said top surface of said semiconductor is dried.

17. The process as recited in claim 16 wherein said step of rotating said vacuum chuck of said wafer coating system about a central axis thereof further includes maintaining said first rotational speed of said semiconductor wafer for in the range of 3-5 seconds.

18. The method as recited in claim 16 wherein said step of decelerating said semiconductor wafer from said first rotational speed to said second rotational speed while concurrently centrally applying said photoresist material to said top surface of said semiconductor wafer further includes decelerating said semiconductor wafer at a constant deceleration in the range of 50 to 150 rpm/sec.

19. The method as recited in claim 16 wherein said step of decelerating said semiconductor wafer from said first rotational speed to said second rotational speed while concurrently centrally applying said photoresist material to said top surface of said semiconductor wafer further includes applying in the range of 1.5-3.5 grams of said photoresist material to said top surface of said semiconductor wafer.

* * * * *